(12) United States Patent
Jang et al.

(10) Patent No.: US 6,451,637 B1
(45) Date of Patent: Sep. 17, 2002

(54) METHOD OF FORMING A POLYCRYSTALLINE SILICON FILM

(75) Inventors: Jin Jang; Sung-Hoon Kim, both of Seoul (KR)

(73) Assignee: L.G. Philips LCD Co., Ltd., Seoul (KR)

(*) Notice: Subject to any disclaimer, the term of this patent is extended or adjusted under 35 U.S.C. 154(b) by 0 days.

(21) Appl. No.: 09/493,201

(22) Filed: Jan. 28, 2000

Related U.S. Application Data

(63) Continuation-in-part of application No. 09/350,816, filed on Jul. 9, 1999.

(30) Foreign Application Priority Data

Jul. 10, 1998 (KR) .............................. 98-27715
Oct. 21, 1998 (KR) .............................. 98-44229
Jan. 28, 1999 (KR) .............................. 99-2776

(51) Int. Cl.$^7$ ............................................. H01L 21/00
(52) U.S. Cl. ........................................ 438/166; 438/486
(58) Field of Search .......................... 438/166, 485–487

(56) References Cited

U.S. PATENT DOCUMENTS 4,379,181 A * 4/1983 Cannella ..................... 438/62
5,923,968 A * 7/1999 Yamakazi
5,923,997 A * 7/1999 Mitanaga ................... 438/486
6,048,758 A * 4/2000 Yamakazi ................... 438/166
6,297,080 B1 * 10/2001 Lee et al. ..................... 257/55
6,309,951 B1 * 10/2001 Jang ........................... 438/166

FOREIGN PATENT DOCUMENTS

KR          97-1608          1/1997

* cited by examiner

Primary Examiner—John F. Niebling
Assistant Examiner—Stacy A Whitmore
(74) Attorney, Agent, or Firm—McKenna Long & Aldridge LLP

(57) ABSTRACT

The present invention related to a method of forming a polycrystalline silicon film which forms a polysilicon film by crystallizing silicon by means of carrying out plasma exposure and applying an electric field thereon. The present invention includes the steps of forming a metal plasma exposure layer on a substrate wherein the metal plasma exposure layer works as a catalyst for metal induced crystallization, and depositing amorphous silicon on the substrate on which the plasma exposure layer is formed while an electric field is applied thereon. The present invention enables to crystallize the whole film in such a short annealing time less than 10 minutes by forming a metal layer under a silicon layer by plasma particle exposure and, successively, by crystallizing silicon which is being formed under 520° C. And, the present invention reduces metal contamination in the crystallized silicon film as the amount of metal is easy to be controlled by plasma exposure time. Moreover, the present invention enables to form a polysilicon film several $\mu$m thick as it is easy to form polysilicon of which thickness does not matter.

40 Claims, 4 Drawing Sheets

METHOD OF FORMING A POLYCRYSTALLINE SILICON FILM

This application is a Continuation-in-part (CIP) of application Ser. No. 09/350,816 Filed on Jul. 9, 1999 (pending).

BACKGROUND OF THE INVENTION

1. Field of Invention

The present invention related to a method of forming a polycrystalline silicon film which forms a polysilicon film by crystallizing silicon by means of carrying out plasma exposure and applying an electric field thereon.

2. Discussion of Related Art

In view of performance, low temperature polysilicon, of which product cost is low owing to its low formation temperature and which also enables to provide an large-scale display area, is as good as high temperature polysilicon.

There are various methods for forming low temperature polysilicon such as solid phase crystallization(SPC), laser crystallization and the like.

Enabling to provide low temperature crystallization under 400° C., which is disclosed in [Hiroyaki Kuriyama, et. al, Jpn. J. Appl. Phys. 31, 4550 (1992)], the laser crystallization fails to provide uniform crystallization and has difficulty in forming polysilicon on a substrate of a large area due to an expensive apparatus and low productivity.

When polysilicon is formed by solid phase crystallization, uniform crystallites are attained in use of an inexpensive apparatus. However, solid phase crystallization requires high temperature and long processing time of crystallization, which is hardly applied to forming polysilicon on a glass substrate.

A new method of crystallizing amorphous silicon at low temperature, which is so-called metal induced crystallization, is disclosed in [M. S. Haque, et. al, J. Appl. Phys. 79, 7529(1996)]. Metal induced crystallization crystallizes amorphous silicon by contacting amorphous silicon with a specific kind of metal which induces crystallization of silicon and then by carrying out annealing, thereby enabling to lower crystallization temperature.

In Ni-induced crystallization, crystallization is accelerated by the $NiSi_2$ which is the final phase of Ni silicide and works as a crystal nucleus, which is disclosed in [C. Hayzelden, et. al, J. Appl. Phys. 73, 8279 (1993)]. As a matter of fact, $NiSi_2$, of which lattice constant is 5.406 Å similar to 5.430 Å of silicon, has the similar structure of silicon. Thus, $NiSi_2$ works as a crystal nucleus of amorphous silicon, accelerating crystallization to the direction <111>, which is disclosed in [C. Hayzelden, et. al, Appl. Phys. Lett. 60, 225 (1992)]. The crystallization of amorphous silicon is accelerated by metal species.

The metal-induced crystallization is affected by time and temperature of annealing as well as quantity of metal, of which crystallization time is lowered in general while the quantity of metal increases.

Metal induced crystallization has a merit of low crystallization temperature, unfortunately requiring long thermal process time over 20 hours at 500° C. Therefore, this method has many difficulties in being applied to mass production of polycrystalline silicon.

As quantity of metal increases, so metal induced crystallization becomes effective. However, intrinsic characteristics of a silicon film are changed due to metal contamination in the crystallized silicon film.

As mentioned in the above explanation, MIC requires long thermal process time over 20 hours at 500° C. for crystallization. Thus, it still requires high crystallization temperature and long process time.

As the amount of metal in the film increases, so does the effect of MIC as well as metal contamination. Such contamination causes the change of intrinsic characteristics of a silicon film.

Accordingly, it is very important to lower the time and temperature of thermal process of crystallization as well as reduce the metal contamination in the silicon film crystallized by MIC.

SUMMARY OF THE INVENTION

Accordingly, the present invention is directed to a method of forming a polycrystalline silicon film that substantially obviates one or more of the problems due to limitations and disadvantages of the related art.

The object of the present invention is to provide a method of forming a polycrystalline silicon film which lowers the time and temperature of crystallization.

Another object of the present invention is to provide a method of forming a polycrystalline silicon film which reduces the metal contamination in a crystallized silicon film by means of controlling plasma density and plasma exposure time.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of forming a metal plasma exposure layer on a substrate wherein the metal plasma exposure layer works as a catalyst for metal induced crystallization, and depositing amorphous silicon on the substrate on which the plasma exposure layer is formed while an electric field is applied thereon.

In another aspect, the present invention includes the steps of forming a metal plasma exposure layer on a substrate wherein the metal plasma exposure layer works as a catalyst for metal induced crystallization, forming a first amorphous silicon film to a predetermined thickness on the plasma exposure layer, and depositing a second amorphous silicon on the substrate while an electric field is applied to the substrate where the plasma exposure layer and the amorphous silicon layer are formed.

In a further aspect, the present invention includes the steps of forming a metal plasma exposure layer on a substrate wherein the metal plasma exposure layer works as a catalyst for metal induced crystallization, and depositing an amorphous substance on the substrate where the plasma exposure layer is formed while an electric field is applied to the substrate, wherein silicide is generated from a reaction between the amorphous substance and metal of the plasma exposure layer as soon as the amorphous substance is deposited and wherein crystallization is induced by the silicide.

In a further aspect, the present invention includes the steps of depositing a first thin amorphous silicon layer on an insulating substrate, forming a metal plasma exposure layer on the thin amorphous silicon layer on the substrate while an electrical field is applied to the substrate where the amorphous silicon and the metal plasma exposure layer are formed, and forming a second amorphous silicon layer on the metal plasma and the first amorphous silicon layer in an electric field.

In a further aspect, the present invention includes the steps of depositing a first thin amorphous silicon layer on an insulating substrate in an electric field, forming a metal plasma exposure layer on the thin amorphous silicon layer on the substrate while an electrical field is applied to the substrate where the amorphous silicon and the metal plasma exposure layer are formed, and forming a second amorphous silicon layer on the metal plasma and the first amorphous silicon layer in an electric field.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF PREFERRED EMBODIMENTS

Reference will now be made in detail to the preferred embodiments of the present invention, examples of which are illustrated in the accompanying drawings.

A method of forming a polysilicon film according to the present invention begins the step of crystallizing silicon to form a polysilicon film during the process of forming an amorphous silicon film at low temperature by means of accelerating the crystallization of a film in use of an electric field and metal plasma particles, thereby reducing the time of crystallization enormously.

In the present invention, a metal plasma layer is formed on an insulating substrate of quartz, glass, oxide, etc. by forming metal plasma in use of RF or DC plasma.

Then, a polysilicon film is formed on the insulating substrate when an amorphous silicon is deposited by applying an electric field thereon. In this case, the polysilicon film is formed as soon as the amorphous silicon film is deposited as the crystallization occurs simultaneously.

Metal plasma is generated provided that RF voltage is applied to an electrode made of a catalyst for metal induced crystallization such as Ni, etc. under the ambience of He or $N_2$.

After the substrate has been exposed to the metal plasma, silicon is deposited on the substrate as soon as an electric field is applied to the substrate. During this process of deposition, a polysilicon film is deposited on the substrate as silicon is crystallized.

In this case, the amount of metal in the film is controlled by manipulating the power and exposure time of RF or DC plasma. The exposure time of plasma may be set from 0.1 to 1000 seconds.

Besides, after the substrate has been exposed to plasma, voltage may be applied to both ends of the substrate without plasma. In order to apply an electric field to the substrate, a couple of metal plates may be put on both ends of the substrate to be used as electrodes. Then, plasma is generated in a chamber through a metal bar or metal plate to have specific metal is deposited on the substrate only by plasma. In this case, the metal is transition metal such as Ni, Mo, Co, Fe, NiAu or the like or a metal catalyst for MIC.

Figure 1:
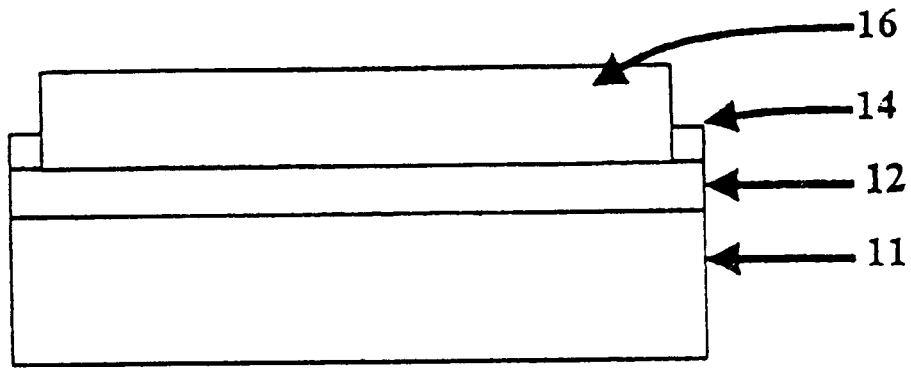
FIG. 1 shows a cross-sectional view of a sample having a polysilicon film formed by an embodiment of the present invention.

FIG. 1 shows a cross-sectional view of a sample having a polysilicon film formed by an embodiment of the present invention.

Referring to FIG. 1, an insulating layer 12 as a buffer layer is formed on an insulating substrate 11 such as a glass substrate and, a polysilicon film 16 is formed on the buffer layer 12.

On the insulating layer 12, electrodes 14 are formed to generate an electric field during the process of forming a silicon film.

As mentioned in the above description of the present invention, after a metal plasma layer has been formed on the insulating layer 12 by exposing metal plasma, amorphous silicon is deposited while an electric field is applied through the electrodes 14. In this case, a polysilicon film 16 is formed b the crystallization induced by the metal plasma exposed layer as soon as the amorphous silicon is deposited.

Figure 2A:
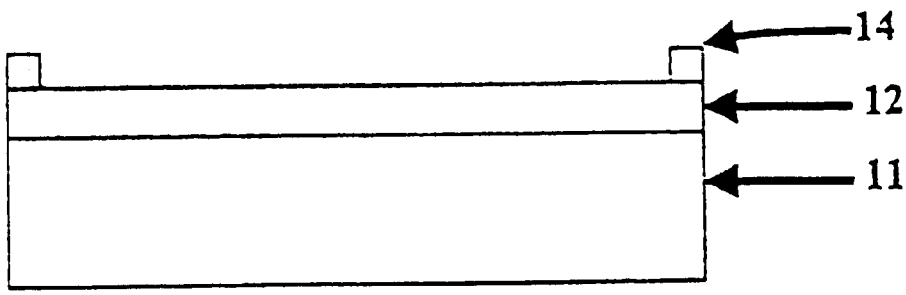
FIG. 2A to FIG. 2C show cross-sectional views of forming a polysilicon film shown in FIG. 1.
Figure 2B:
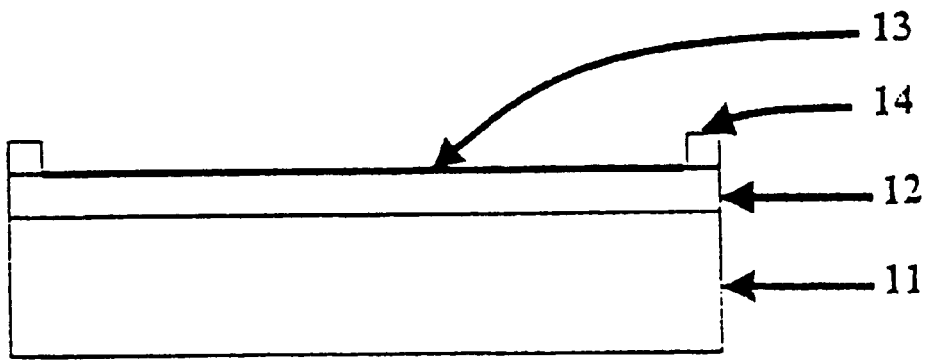
Figure 2C:
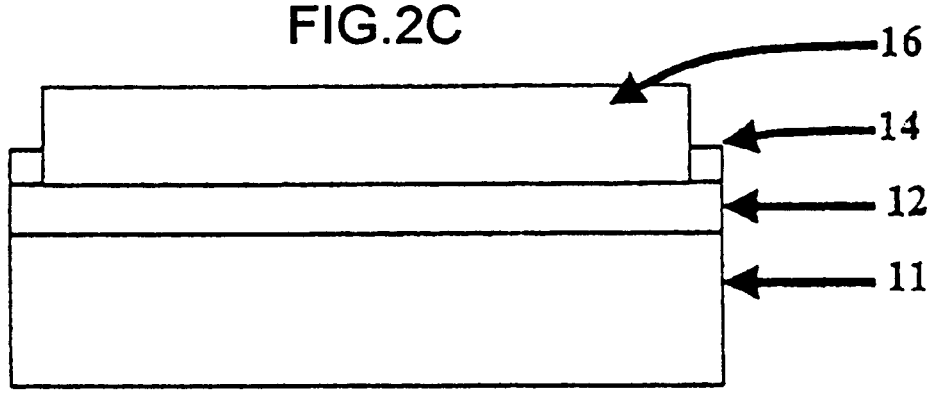

FIG. 2A to FIG. 2C show cross-sectional views of forming a polysilicon film shown in FIG. 1.

Referring to FIG. 2A, a buffer layer 12 1000 Å thick is formed on an insulating substrate 11 of glass. The buffer layer 12 prevents impurities of the insulating substrate 11 from penetrating into a polysilicon film during the formation of the polysilicon layer. The buffer layer 12 may be formed by PECVD and is mainly formed of silicon oxide.

A pair of electrodes 14 are established on the buffer layer 12 to apply predetermined voltage to the substrate.

Referring to FIG. 2B, a plasma exposure layer 13 is formed on the buffer layer 12 by having the buffer layer exposed to metal plasma working as a catalyst such as Ni for MIC.

The metal plasma is generated by applying RF voltage to the electrodes of metal working as a catalyst for MIC. Then, the substrate having the buffer layer 12 is exposed to the metal plasma.

The plasma exposure layer 13 having 0.01 to 10 Å thickness is formed on the buffer layer 12. In this case, the plasma exposure layer 13 may be formed on the substrate totally or locally.

Referring to FIG. 2C, amorphous silicon is deposited on the substrate on which the plasma exposure layer 13 is formed while an electric field of 1~100 V/cm is applied to the substrate.

When amorphous silicon is deposited, the silicon becoming contacted with the plasma exposure layer 13 forms silicide by being reacted with metal of the plasma exposure layer 13. In this case, metal induced crystallization occurs as silicide accelerates silicon crystallization.

As a result, a polysilicon film 16 is formed as the amorphous silicon is crystallized. In this case, the amorphous silicon is crystallized as soon as is deposited. Namely, the amorphous silicon experiences crystallization as soon as is deposited. Thus, after the completion of deposition, the polysilicon film is formed on the substrate in such a short time.

As mentioned in the above description, the polysilicon film is formed by applying an electric field to the plasma exposure layer 13 and, by depositing silicon thereon, simultaneously.

Besides, the polysilicon film may be formed on the substrate in a dramatically-short time by depositing silicon while an electric field is applied to the substrate after an amorphous silicon film 5 to 1000 Å thick has been formed on the plasma exposure layer 13.

Namely, generated from the reaction between the plasma exposure layer 13 and the amorphous silicon film previously deposited under the electric field, silicide crystallizes the silicon which is being deposited.

Therefore, the present invention initiates the step of crystallizing silicon to form a polysilicon film during the process of forming an amorphous silicon film at low temperature by means of accelerating the crystallization of a film in use of an electric field and metal plasma particles, thereby reducing the time of crystallization enormously.

Another embodiment of the present invention is described as follows.

A first thin amorphous silicon layer is deposited on an insulating substrate. And then, a metal plasma exposure layer is formed on the thin amorphous silicon layer on the substrate while an electrical field is applied to the substrate where the amorphous silicon and the metal plasma exposure layer are formed. And then, a second amorphous silicon layer is formed on the metal plasma and the first amorphous silicon layer in an electric field.

In this case, the second amorphous silicon is crystallized as soon as is deposited. Namely, the second amorphous silicon experiences crystallization as soon as is deposited. Thus, after the completion of deposition, the polysilicon film is formed on the substrate in such a short time.

Also, the other embodiment of the present invention is described as follows.

A first thin amorphous silicon layer is deposited on an insulating substrate in an electric field. And then, a metal plasma exposure layer is formed on the thin amorphous silicon layer on the substrate while an electrical field is applied to the substrate where the amorphous silicon and the metal plasma exposure layer are formed. And then, a second amorphous silicon layer is formed on the metal plasma and the first amorphous silicon layer in an electric field.

In this case, the second amorphous silicon is crystallized as soon as is deposited. Namely, the second amorphous silicon experiences crystallization as soon as is deposited. Thus, after the completion of deposition, the polysilicon film is formed on the substrate in such a short time.

Figure 3:
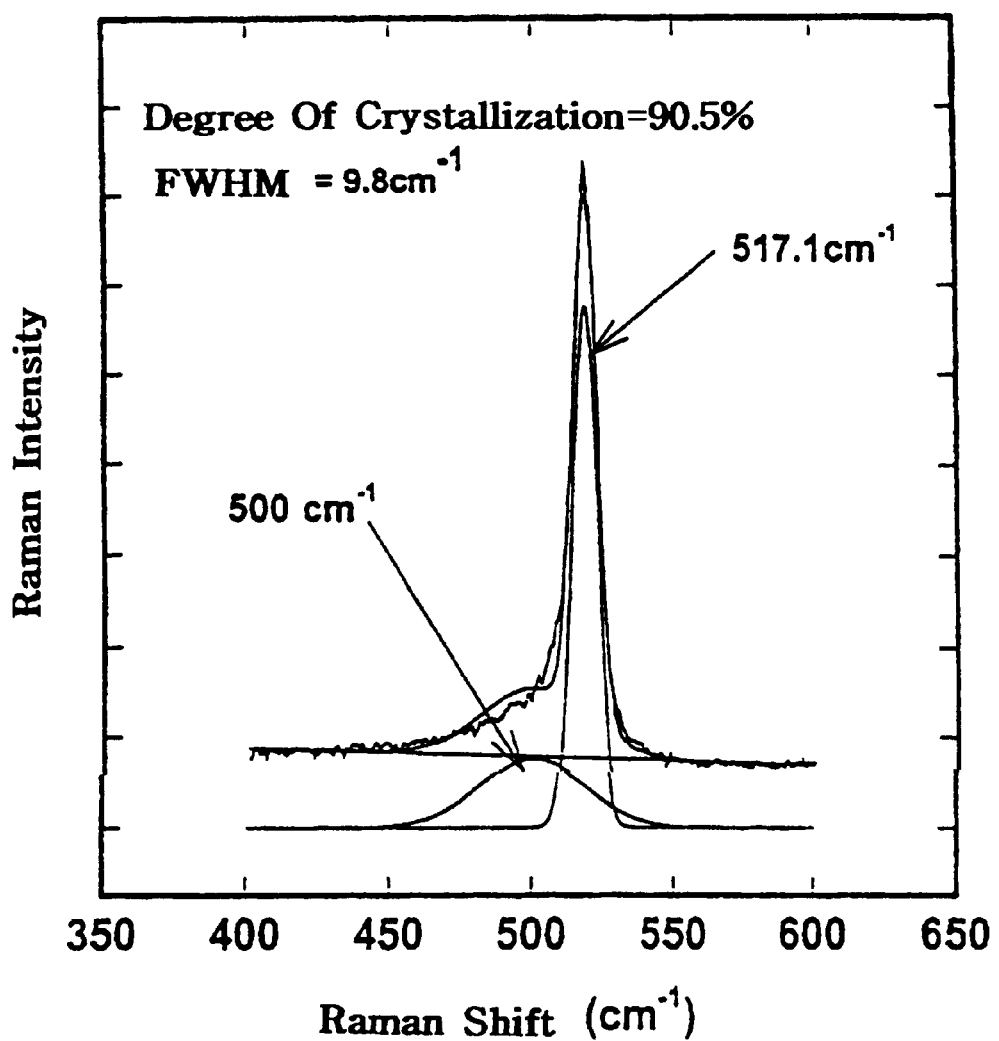
FIG. 3 shows a graph of Raman spectrum of a polysilicon film crystallized by an embodiment of the present invention at 520° C.

FIG. 3 shows a graph of Raman spectrum of a polysilicon film crystallized by an embodiment of the present invention at 520° C.

Referring to FIG. 3, plasma is generated by RF, wherein plasma power is 80W, nitrogen gas is used as an excited gas, and an electric field of maximum 6.5 V/cm is applied to both ends of the substrate.

The Raman peaks of the silicon crystallites show up a sharp peak by TO(transverse optical) phonon mode near ~520 $cm^{-1}$ and a broad peak by nono-crystals near ~500 $cm^{-1}$. Therefore, it is noticed that crystallization is completed. The degree of crystallization is 90.5% and Full Width at Half Maximum (FWHM) is 9.8 $cm^{-1}$.

Figure 4:
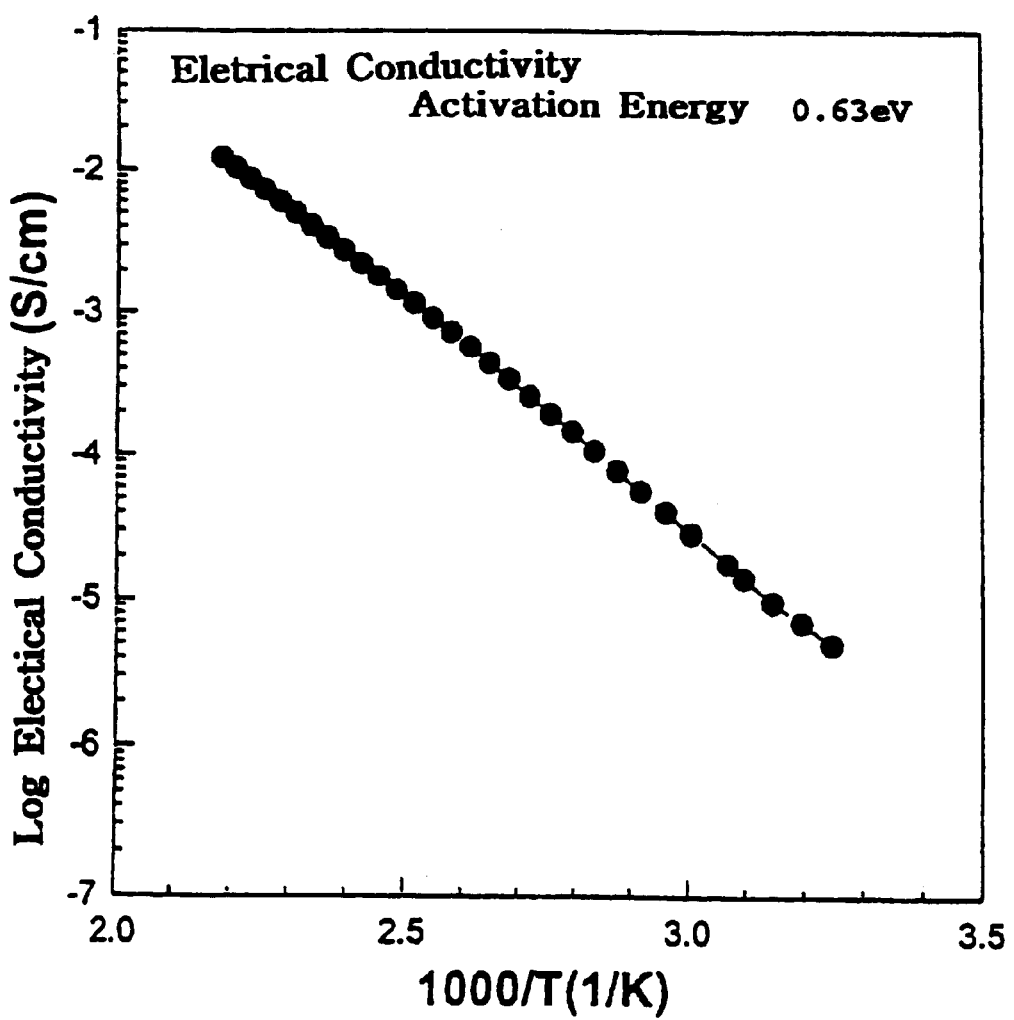
FIG. 4 shows a graph of electrical conductivity of a polysilicon film fabricated by an embodiment of the present invention.

FIG. 4 shows a graph of electrical conductivity of a polysilicon film fabricated by an embodiment of the present invention.

Referring to FIG. 4, having been exposed to metal plasma for 20 minutes with RF power of 80W, silicon is crystallized at 520° C. for 10 minutes while an electric field of 6.5 V/cm is applied to both ends of the amorphous silicon.

Electrical conductivity activation energy if the polysilicon film through crystallization is 0.63 eV, and the room temperature electrical after the crystallization is $10^{-6}$S/cm. Hopping conduction does not occur, while an activated form which is similar to that of the other polysilicon film formed by ELA(eximer laser annealing) shows up.

As mentioned in the above description, the present invention enables to crystallize the whole film in such a short annealing time less than 10 minutes by forming a metal layer under an amorphous silicon layer by plasma particle exposure and, successively, by crystallizing the amorphous silicon which is being formed under 520° C.

And, the present invention reduces metal contamination in the crystallized silicon film as the amount of metal is easy to be controlled by plasma exposure time.

Moreover, the present invention enables to form a polysilicon film several µm thick as it is easy to form polysilicon of which thickness does not matter.

It will be apparent to those skilled in the art that various modifications and variations can be made in a method of forming a polycrystalline silicon film of the present invention without departing from the spirit or scope of the inventions. Thus, it is intended that the present invention cover the modifications and variations of this invention provided they come within the scope of the appended claims and equivalents.

What is claimed is:

1. A method of forming a polycrystalline silicon film, comprising the steps of:
   forming a metal plasma exposure layer on a substrate wherein the metal plasma exposure layer works as a catalyst for metal induced crystallization; and
   depositing amorphous silicon on the substrate on which the plasma exposure layer is formed while an electric field is applied thereon.

2. The method of forming a polycrystalline silicon film according to claim 1, wherein the plasma exposure layer is formed on the whole surface of the substrate.

3. The method of forming a polycrystalline silicon film according to claim 1, wherein the plasma exposure layer is formed on the substrate partially.

4. The method of forming a polycrystalline silicon film according to claim 1, wherein the plasma exposure layer 0.01 to 10 Å thick is formed.

5. The method of forming a polycrystalline silicon film according to claim 1, wherein magnitude of the electric field ranges 1~100 V/cm.

6. The method of forming a polycrystalline silicon film according to claim 1, wherein temperature of the substrate is under 520° C.

7. The method of forming a polycrystalline silicon film according to claim 1, wherein the plasma exposure layer is formed of transition metal.

8. The method of forming a polycrystalline silicon film according to claim 7, wherein the transition metal is Ni or Ni alloy.

9. The method of forming a polycrystalline silicon film according to claim 1, wherein the plasma exposure layer is formed by exposing the substrate to metal plasma for 0.1 to 1,000 seconds.

10. A method of forming a polycrystalline silicon film, comprising the steps of:
    forming a metal plasma exposure layer on a substrate wherein the metal plasma exposure layer works as a catalyst for metal induced crystallization;
    forming a first amorphous silicon film to a predetermined thickness on the plasma exposure layer; and
    depositing a second amorphous silicon film on the substrate while an electric field is applied to the substrate where the plasma exposure layer and the amorphous silicon films are formed.

11. The method of forming a polycrystalline silicon film according to claim 10, wherein the first amorphous silicon film 5 to 1000 Å thick is formed.

12. The method of forming a polycrystalline silicon film according to claim 10, wherein the plasma exposure layer is formed on the whole surface of the substrate.

13. The method of forming a polycrystalline silicon film according to claim 10, wherein the plasma exposure layer is formed on the substrate partially.

14. The method of forming a polycrystalline silicon film according to claim 10, wherein the plasma exposure layer 0.01 to 10 Å thick is formed.

15. The method of forming a polycrystalline silicon film according to claim 10, wherein magnitude of the electric field ranges 1~100 V/cm.

16. The method of forming a polycrystalline silicon film according to claim 10, wherein temperature of the substrate is under 520° C.

17. The method of forming a polycrystalline silicon film according to claim 10, wherein the plasma exposure layer is formed of transition metal.

18. The method of forming a polycrystalline silicon film according to claim 17, wherein the transition metal is Ni or Ni alloys.

19. The method of forming a polycrystalline silicon film according to claim 10, wherein the plasma exposure layer is formed by exposing the substrate to metal plasma for 0.1 to 1,000 seconds.

20. A method of forming a polycrystalline silicon film, comprising the steps of:
    forming a metal plasma exposure layer on a substrate wherein the metal plasma exposure layer works as a catalyst for metal induced crystallization; and
    depositing an amorphous substance on the substrate where the plasma exposure layer is formed while an electric field is applied to the substrate, wherein silicide is generated from a reaction between the amorphous substance and metal of the plasma exposure layer as soon as the amorphous substance is deposited and wherein crystallization is induced by the silicide.

21. A method of forming a polycrystalline silicon film, comprising the steps of:
    depositing a first thin amorphous silicon layer on an insulating substrate;
    forming a metal plasma exposure layer on the thin amorphous silicon layer on the substrate while an electrical field is applied to the substrate where the amorphous silicon layer and the metal plasma exposure layer are formed; and
    forming a second amorphous silicon layer on the metal plasma exposure layer and the first amorphous silicon layer in an electric field.

22. The method of forming a polycrystalline silicon film according to claim 21, wherein the first amorphous silicon layer 5 to 1000 Å thick is formed.

23. The method of forming a polycrystalline silicon film according to claim 21, wherein the plasma exposure layer is formed on the whole surface of the substrate.

24. The method of forming a polycrystalline silicon film according to claim 21, wherein the plasma exposure layer is formed on the substrate partially.

25. The method of forming a polycrystalline silicon film according to claim 21, wherein the plasma exposure layer 0.01 to 10 Å thick is formed.

26. The method of forming a polycrystalline silicon film according to claim 21, wherein magnitude of the electric field ranges 1~100 V/cm.

27. The method of forming a polycrystalline silicon film according to claim 21, wherein temperature of the substrate is under 520° C.

28. The method of forming a polycrystalline silicon film according to claim 21, wherein the plasma exposure layer is formed of transition metal.

29. The method of forming a polycrystalline silicon film according to claim 28, wherein the transition metal is Ni or Ni alloys.

30. The method of forming a polycrystalline silicon film according to claim 21, wherein the plasma exposure layer is formed by exposing the substrate to metal plasma for 0.1 to 1,000 seconds.

31. A method of forming a polycrystalline silicon film, comprising the steps of:
    depositing a first thin amorphous silicon layer on an insulating substrate in an electric field;
    forming a metal plasma exposure layer on the first thin amorphous silicon layer on the substrate while an electrical field is applied to the substrate where the first thin amorphous silicon layer and the metal plasma exposure layer are formed; and
    forming a second amorphous silicon layer on the metal plasma exposure layer and the first thin amorphous silicon layer in an electric field.

32. The method of forming a polycrystalline silicon film according to claim 31, wherein the first thin amorphous silicon layer 5 to 1000 Å thick is formed.

33. The method of forming a polycrystalline silicon film according to claim 31, wherein the plasma exposure layer is formed on the whole surface of the substrate.

34. The method of forming a polycrystalline silicon film according to claim 31, wherein the plasma exposure layer is formed on the substrate partially.

35. The method of forming a polycrystalline silicon film according to claim 31, wherein the plasma exposure layer 0.01 to 10 Å thick is formed.

36. The method of forming a polycrystalline silicon film according to claim 31, wherein magnitude of the electric field ranges 1~100 V/cm.

37. The method of forming a polycrystalline silicon film according to claim 31, wherein temperature of the substrate is under 520° C.

38. The method of forming a polycrystalline silicon film according to claim 31, wherein the plasma exposure layer is formed of transition metal.

39. The method of forming a polycrystalline silicon film according to claim 38, wherein the transition metal is Ni or Ni alloys.

40. The method of forming a polycrystalline silicon film according to claim 31, wherein the plasma exposure layer is formed by exposing the substrate to metal plasma for 0.1 to 1,000 seconds.

* * * * *